United States Patent
Lai

(10) Patent No.: US 7,009,472 B2
(45) Date of Patent: Mar. 7, 2006

(54) LINEAR TUNING CIRCUIT AND TUNING METHOD THEREOF

(75) Inventor: Chih-Hao Lai, Ken-Kong Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 63 days.

(21) Appl. No.: 10/761,984

(22) Filed: Jan. 21, 2004

(65) Prior Publication Data
US 2005/0099249 A1 May 12, 2005

(30) Foreign Application Priority Data
Nov. 7, 2003 (TW) .............................. 92131190 A

(51) Int. Cl.
*H03J 3/06* (2006.01)
(52) U.S. Cl. ..................... 334/15; 331/117 V
(58) Field of Classification Search .................. 334/15, 334/16, 78, 79; 331/177 V, 117 R, 116 R, 331/36 C
See application file for complete search history.

(56) References Cited

U.S. PATENT DOCUMENTS 6,469,587 B1 * 10/2002 Scoggins ................. 331/117 R
6,833,769 B1 * 12/2004 Seppinen et al. ....... 331/177 V

* cited by examiner

*Primary Examiner*—Joseph Chang
(74) *Attorney, Agent, or Firm*—J. C. Patents

(57) ABSTRACT

A linear tuning varactor circuit has the first single-end varactor circuit, the second single-end varactor circuit and a voltage divider. The first single-end varactor circuit has tuning terminal receiving the tuning voltage to change the capacitance thereof The second single-end varactor circuit has a reference voltage terminal receiving the reference with constant voltage. The first single-end varactor circuit and the second single-end varactor circuit are coupled to each other in series and have a node. The voltage divider is coupled to the tuning terminal, the reference voltage terminal and the node. The node has a divided voltage, which results from dividing a voltage difference between the tuning voltage and the reference voltage by the voltage divider with a pre-set voltage dividing ratio.

4 Claims, 11 Drawing Sheets

LINEAR TUNING CIRCUIT AND TUNING METHOD THEREOF

CROSS-REFERENCE TO RELATED APPLICATION

This application claims the priority benefit of Taiwan application Ser. No. 92131190, filed on Nov. 7, 2003.

BACKGROUND OF THE INVENTION

1. Field of the Invention

The present invention relates to a varactor circuit and a tuning method thereof, and more particularly to a linear tuning varactor circuit and a tuning method thereof.

2. Description of the Related Art

Among communication systems, voltage controlled oscillators (VCO) have been widely used to process different signals. In typical communication system, information signals are carried by high-frequency carrier waves for transmission. Through carrier waves with different frequencies, a variety of signals are transmitted. Receivers of communication systems use VCO for extracting signals from the carrier waves. In addition, VCO should be controlled to generate different signals with different frequencies corresponding to the variation of the frequency of the carrier waves.

Because varactors can control the capacitance by controlling the voltage, VCO usually uses LC circuits, composed of varactors and inductances, which can vary the oscillation frequency thereof by tuning the capacitance of the varactors.

FIG. 1A is a prior art single-end varactor circuit. Referring to FIG. 1A, the single-end varactor circuit 10 comprises a varactor 11, a tuning terminal 13, a reference voltage terminal 14 and a connecting terminal 16. The tuning terminal 13 is adapted to receive the tuning voltage $V_{tune}$, and the reference voltage terminal 14 is adapted to receive the reference voltage $V_{dc}$ with a fixed voltage. A terminal of the varactor 11 is coupled to the connecting terminal 16, another terminal is coupled to the reference voltage terminal 14, and the connecting terminal 16 is coupled to the resistor 12 coupled to the tuning terminal 13.

FIG. 1B is a prior art differential varactor circuit. Referring to FIG. 1B, the differential varactor circuit 20 comprises a first single-end varactor circuit 20a and a second single-end varactor circuit 20b. The first single-end varactor circuit 20a comprises a connecting terminal 19, a tuning terminal 28, a corresponding tuning terminal 22 and a varactor 17. The tuning terminal 28 is adapted to receive the tuning voltage $V_{tune}$, and the corresponding tuning terminal 22 is adapted to receive the corresponding tuning voltage $V_{tune,N}$. The resistors 21, 23 and 25 are adapted to receive DC voltages and exclude AC signals. A terminal of the varactor 17 is coupled to the connecting terminal 19, another terminal is coupled to the corresponding tuning terminal 22, and thetuning terminal 28 is couple to the connecting terminal 19 through the resistor 21. The second single-end varactor circuit 20b comprises a connecting terminal 24, a tuning terminal 27, a corresponding tuning terminal 29 and a varactor 18. The tuning terminal 27 is coupled to the tuning terminal 28 of the first single-end varactor 20a, and the corresponding tuning terminal 29 is coupled to the corresponding tuning terminal 22 of the first single-end varactor 20a. A terminal of the varactor 18 is coupled to the corresponding tuning terminal 29, another terminal is coupled to the connecting terminal 24, and the connecting terminal 24 is coupled to the tuning terminal 27 through the resistor 25.

FIG. 2A is a C-V curve showing the relationship of the tuning voltage and the capacitance of an idea varactor circuit. Referring to FIGS. 1A and 2A, the capacitance of the varactor 11 of the varactor circuit 10 is determined by the reference voltage $V_{dc}$ and tuning voltage $V_{tune}$. The tuning voltage $V_{tune}$ is an adjustable voltage, and the DC voltage $V_{dc}$ is fixed. The tuning range V1 of the tuning voltage is:

$$V_1 = V_{tune,M} - V_{dc}$$

Wherein $V_{tune,M}$ is the maximum tuning voltage.

Theoretically, the curve 31 of the varactor circuit is linear. It means that each of the tuning voltages $V_{tune}$ corresponds to different capacitances $C_{var}$ of the varactor circuit.

FIG. 2B is a C-V curve showing the relationship of the tuning voltage and the capacitance of a prior art varactor circuit. The curve 33 of the varactor circuit is not completely linear, but has a linear region A therein. If the tuning range V2 is within the linear region A, the varactor circuit will operate perfectly. If, however, the tuning range V2 is within the saturation region B, the capacitance $C_{var}$ barely changes no matter how to adjust the tuning voltage $V_{tune}$.

For the design of VCO, a wide linear controlling region is desired to generate a small C-V gain, $$\left(\frac{\Delta C_{var}}{\Delta V}\right),$$

under the same tuning range of the capacitance $\Delta C_{var}$. It means that a small voltage oscillation gain, $$\left(K_{VCO} \equiv \frac{\Delta f}{\Delta V}\right),$$

is desired. With the comparison of FIGS. 2A and 2B, FIG. 2A generates a C-V gain, $$\left(\frac{\Delta C_{var}}{\Delta V}\right),$$

smaller than that of FIG. 2B because of the wider linear tuning range. Therefore, it is the circuit that generates a small voltage oscillation gain, $$\left(K_{VCO} \equiv \frac{\Delta f}{\Delta V}\right).$$

U.S. Pat. No. 6,563, 392 granted to Ramon Alejandro Gomez disclosed a parallel method for generating the linear range. However, additional accurate power supplies are required for generating the circuit with the desired performance.

SUMMARY OF THE INVENTION

Therefore, the object of the present invention is to provide a linear tuning varactor circuit, which has linear tuning regionfor operation.

Accordingly, the present invention discloses a linear tuning varactor circuit, which comprises a first single-end varactor circuit, a second single-end varactor circuit and a voltage divider. The first single-end varactor circuit has a tuning terminal and is adapted to receive a tuning voltage for tuning a capacitance thereof. The second single-end varactor circuit has a reference voltage terminal and is adapted to receive a reference voltage with a fixed voltage as a reference level. The voltage divider has a first terminal, a voltage dividing terminal and a second terminal, the first terminal coupled to the tuning terminal of the first single-end varactor circuit, the second terminal coupled to the reference voltage terminal of the second single-end varactor circuit, wherein the first single-end varactor circuit is coupled to the second single-end varactor circuit in series, the voltage dividing terminal of the voltage divider is coupled to a node of the first single-end varactor circuit and the second single-end varactor circuit, and the voltage dividing terminal has a divided voltage, which results from dividing a voltage difference between the tuning voltage and the reference voltage by the voltage divider with a pre-set voltage dividing ratio, such as 1:1.

In the linear tuning varactor circuit described above, the first single-end varactor circuit further comprises a reference voltage terminal, the second single-end varactor circuit further comprises a tuning terminal and a connecting terminal, the reference voltage terminal of the first single-end varactor circuit is coupled to the connecting terminal of the second single-end varactor circuit, and the tuning terminal of the second single-end varactor is coupled to the voltage dividing terminal of the voltage divider.

In the linear tuning varactor circuit described above, the voltage divider further comprises a first resistor and a second resistor coupled to each other in series, a terminal of the first resistor is coupled to the first terminal of the voltage divider, a terminal of the second resistor is coupled to the second terminal of the voltage divider, and a node of the first and the second resistors is coupled to the voltage dividing terminal.

In another aspect, the linear tuning varactor circuit of the present invention comprises a plurality of single-end varactor circuits and a voltage divider. Each of the varactor circuits has a tuning terminal and a reference voltage terminal, the single-end varactor circuits are coupled in series, a tuning terminal of the first single-end varactor circuits is adapted to receive a tuning voltage for tuning a capacitance thereof, and a reference voltage terminal of a last single-end varactor circuit is adapted to receive a reference voltage as a reference level. The voltage divider has a first terminal, a plurality of voltage dividing terminals and a second terminal, wherein the first terminal is coupled to the tuning terminal of the first single-end varactor circuit, the second terminal is coupled to the reference voltage terminal of the last single-end varactor circuit, the voltage dividing terminals of the voltage divider are coupled to nodes of the single-end varactor circuits, and each of the voltage dividing terminals has a divided voltage, which results from dividing a voltage difference between the tuning voltage and the reference voltage by the voltage divider with a pre-set voltage dividing ratio.

In the linear tuning varactor circuit described above, the single-end varactor circuits further comprise connecting terminals, a connecting terminal of a second single-end varactor circuit is coupled to the reference voltage terminal of the first single-end varactor circuit, a reference voltage of the second single-end varactor is coupled to a connecting terminal of a third single-end varactor circuit, and the others follow a connection similar thereto. Except of the first single-end varactor circuit, the tuning terminals of the rest of the single-end varactor circuits are coupled to the voltage dividing terminals of the voltage divider.

In the linear tuning varactor circuit described above, the voltage divider further comprises a plurality of resistors coupled in series, a terminal of a first resistor of the resistors is coupled to the first terminal, a terminal of a last resistor is coupled to the second terminal, and nodes of resistors are the voltage dividing terminals.

In another embodiment, the present invention also discloses a linear tuning varactor circuit, which comprises a first set of single-end varactor circuits, a second set of single-end varactor circuits, a first voltage divider and a second voltage divider. The first set of single-end varactor circuits comprises a plurality of single-end varactor circuits, having a tuning terminal and a corresponding tuning terminal, the single-end varactor circuits coupled in series, a tuning terminal of the first single-end varactor circuit adapted to receive a tuning voltage, a corresponding tuning terminal of the last varactor circuit adapted to receive a corresponding tuning voltage for determining a capacitance thereof. The second set of single-end varactor circuits comprises a plurality of single-end varactor circuit circuits, having a tuning terminal and a corresponding tuning terminal, the second set of single-end varactor circuits have the same amount of varactor circuits similar as those of the first set of single-end varactor circuits, the varactor circuits also coupled in series, the first set of single-end varactor circuits coupled to the second set of single-end varactor circuits in series. The first voltage divider has a first terminal, a plurality of voltage dividing terminals and a second terminal, the first terminal coupled to the tuning terminal of the first single-end varactor circuit of the first set of single-end varactor circuits, the second terminal coupled to the corresponding tuning terminal of the last single-end varactor circuit of the first set of single-end varactor circuits, wherein the voltage dividing terminals of the voltage divider are coupled to nodes of the single-end varactor circuits of the first set of single-end varactor circuits, and each of the voltage dividing terminals has a divided voltage, which results from dividing a voltage difference between the tuning voltage and the reference voltage by the first voltage divider with a pre-set voltage dividing ratio. The second voltage divider has a first terminal, a plurality of voltage dividing terminals and a second terminal, the first terminal coupled to the tuning terminal of the first single-end varactor circuit of the second set of single-end varactor circuits, the second terminal coupled to the corresponding tuning terminal of the last single-end varactor circuit of the second set of single-end varactor circuits, wherein the voltage dividing terminals of the voltage divider are coupled to nodes of the single-end varactor circuits of the second set of single-end varactor circuits, and each of the voltage dividing terminals has a divided voltage, which results from dividing a voltage difference between the tuning voltage and the reference voltage by the second voltage divider with a pre-set voltage dividing ratio.

In the linear tuning varactor circuit described above, the single-end varactor circuits of the first set of single-end varactor circuits further comprise connecting terminals, a connecting terminal of a second single-end varactor circuit is coupled to the corresponding tuning terminal of the first single-end varactor circuit, a corresponding tuning terminal of the second single-end varactor circuit is coupled to a connecting terminal of a third single-end varactor circuit, and the others follow a connection similar thereto. Except of the first single-end varactor circuit, the tuning terminals of the single-end varactor circuits of the first set of single-end varactor circuits are coupled to the voltage dividing terminals of the voltage divider.

In the linear tuning varactor circuit described above, the second set of single-end varactor circuits further comprise connecting terminals, the tuning terminal of the first single-end varactor circuit thereof is coupled to the tuning terminal of the first single-end varactor circuit of the first set of single-end varactor circuits, the corresponding tuning terminal of the last single-varactor circuit thereof is coupled to the corresponding tuning terminal of the last single-end varactor circuit of the first set of single-end varactor circuits, a connecting terminal of a second single-end varactor circuit is coupled to the corresponding tuning terminal of the first single-end varactor circuit, a corresponding tuning terminal of the second single-end varactor circuit is coupled to a connecting terminal of a third single-end varactor circuit, and the others follow a connection similar thereto. Except for the first single-end varactor circuit thereof, the tuning terminals of the single-end varactor circuits of the second set of single-end varactor circuits are coupled to the voltage dividing terminals of the second voltage divider.

In the linear tuning varactor circuit described above, the first and the second voltage dividers further comprise a plurality of resistors coupled in series, a terminal of a first resistor of the first divider is coupled to the first terminal of the first voltage divider, a terminal of a last resistor is coupled to the second terminal of the first voltage divider, and nodes of resistors are coupled to the voltage dividing terminals of the first voltage divider.

Similar to the first voltage divider, the resistors of the second voltage divider are coupled in series, a terminal of a first resistor of the second divider is coupled to the first terminal of the second voltage divider, a terminal of a last resistor is coupled to the second terminal of the second voltage divider, and nodes of resistors are coupled to the voltage dividing terminals of the second voltage divider.

Another object of the present invention is to provide a method of tuning a linear tuning varactor circuit, which is adapted to tune the circuit. The linear tuning varactor circuit comprises a plurality of single-end varactor circuits and a voltage divider, the voltage divider comprising a plurality of resistors, the number of the single-end varactor circuits corresponding to a level of the linear tuning varactor circuit, a variation of a capacitance thereof determined by a tuning voltage and a reference voltage. The method comprises: tuning the capacitance of the linear tuning varactor circuit; determining whether a tuning range of the capacitance thereof is a linear region; and when the tuning range is not a linear region, narrowing the tuning range and determining whether a narrowed region is a linear region.

In the method of tuning a linear tuning varactor circuit of the present invention, when resistances of the resistor are same, the narrowing step comprises: increasing the level of the linear tuning varactor circuit; deducting the reference voltage from the tuning voltage to get a tuning voltage range value; and dividing the tuning voltage range value by the level of the linear tuning varactor circuit for generating a narrowed tuning range.

In the method of tuning a linear tuning varactor circuit of the present invention, the step of determining whether the tuning range of the capacitance thereof is a linear region comprises: inputting the tuning voltages. Determining whether a different portion of the tuning voltages correspond to the same capacitances of the linear tuning varactor circuit or not. When the different portion of the tuning voltages are not higher than the pre-set percentage, the tuning range of the capacitance of the linear varactor circuit is a linear region When the different portion of the tuning voltages are higher than the pre-set percentage, the tuning range of the capacitance of the linear varactor circuit is not a linear region.

In another aspect, the present invention provides another method of tuning a linear tuning varactor circuit, which is adapted to tune the circuit. The linear tuning varactor circuit comprises a first set of single-end varactor circuits, a second set single-end varactor circuits, a first voltage divider and a second voltage divider, the first and the second sets of single-end varactor circuits having a plurality of single-end varactor circuits, the first and the second voltage dividers comprising a same number resistors, the number of the resistors corresponding to a level of the linear tuning varactor circuit, a variation of a capacitance thereof determined by a tuning voltage and a reference voltage. The method comprises: tuning the capacitance of the linear tuning varactor circuit; determining whether a tuning range of the capacitance thereof is a linear region; and when the tuning range is not a linear region, narrowing the tuning range and determining whether a narrowed region is a linear region.

In the method of tuning a linear tuning varactor circuit of the present invention, when resistances of all resistors are same, the narrowing step comprises: increasing the level of the linear tuning varactor circuit; deducting the reference voltage from the tuning voltage to get a tuning voltage range value; and dividing the tuning voltage range value by the level of the linear tuning varactor circuit for generating a narrowed tuning range.

In the method of tuning a linear tuning varactor circuit of the present invention, the step of determining whether the tuning range of the capacitance thereof is a linear region comprises: inputting the tuning voltages. Determining whether a different portion of the tuning voltages correspond to the same capacitances of the linear tuning varactor circuit or not. When the different portion of the tuning voltages are not higher than a pre-set percentage, the tuning range of the capacitance of the linear varactor circuit is a linear region. When the different portion of the tuning voltages are higher than the pre-set percentage, the tuning range of the capacitance of the linear varactor is not a linear region.

Accordingly, the linear tuning varactor circuit and the linear tuning method thereof of the present invention can narrow the tuning range of the capacitance thereof to be within a linear region and to operates therein.

In order to make the aforementioned and other objects, features and advantages of the present invention understandable, a preferred embodiment accompanied with figures is described in detail below.

DESCRIPTION OF SOME EMBODIMENTS

Prior to the interpretation of the embodiment of the present invention, the varactors of the present invention are accumulation mode MOS varactors. Although depletion mode MOS varactors have sufficient linearity, they operate, however, in negative bias as to not be applied to differential designs. Even though the accumulation mode MOS varactors can be applied to differential designs, they do not have sufficient linearity. Therefore, the present invention discloses the circuit and method applied thereto.

Figure 1A:
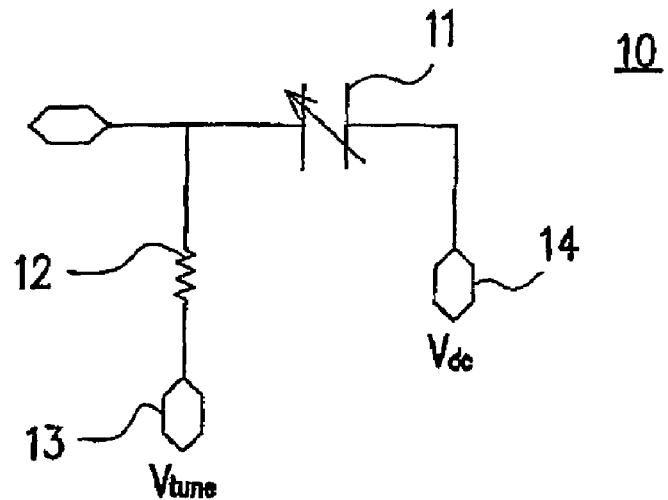
FIG. 1A is a schematic view showing a single-end varactor circuit of a prior art.
Figure 1B:
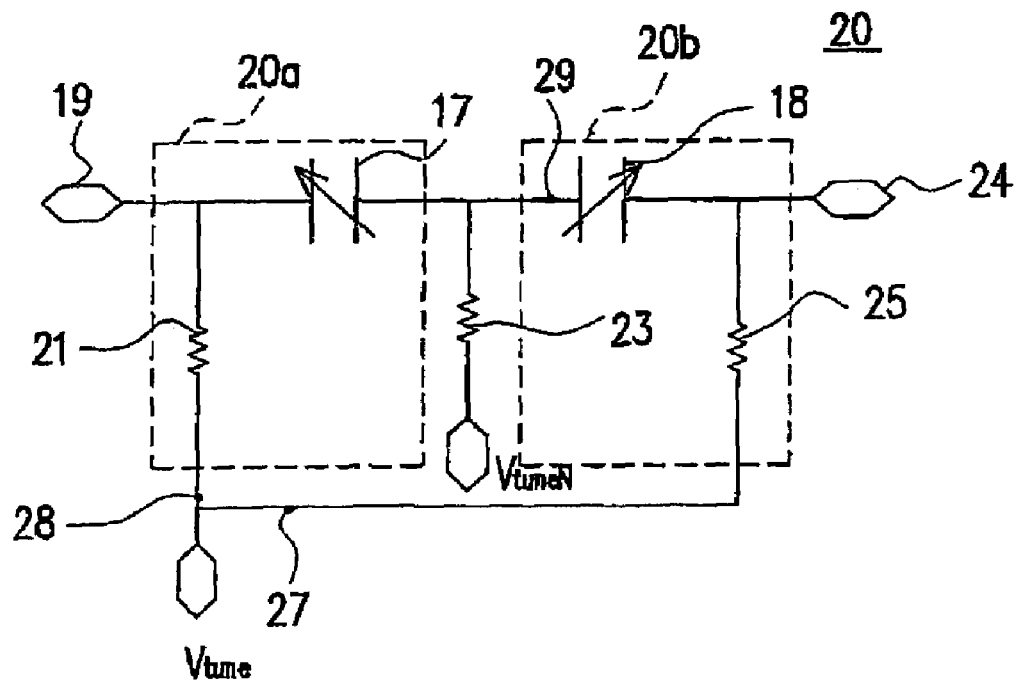
FIG. 1B is a schematic view showing a differential varactor circuit of a prior art.
Figure 2A:
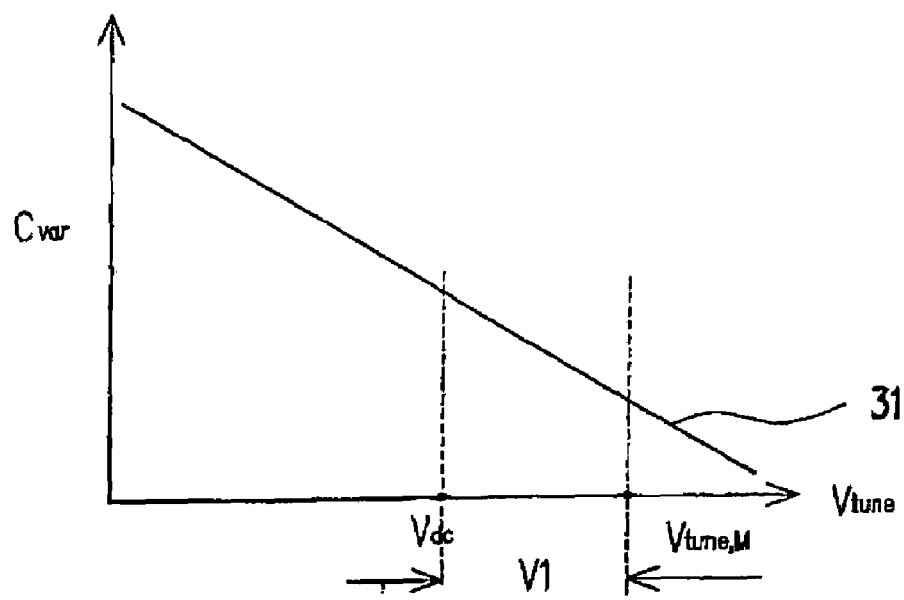
FIG. 2A is a C-V curve showing the relationship of the tuning voltage and the capacitance of an idea varactor circuit.
Figure 2B:
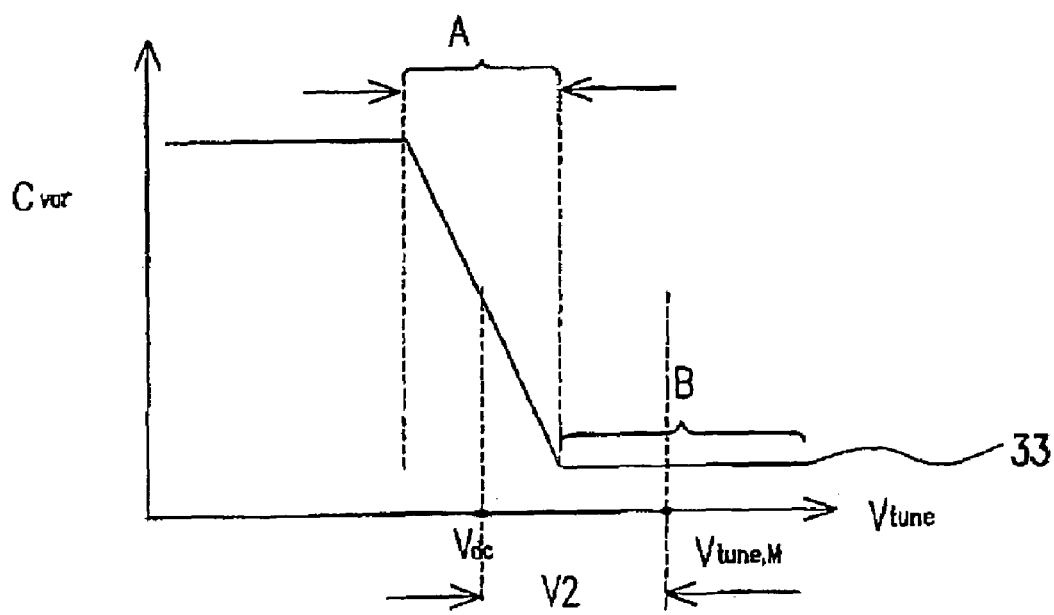
FIG. 2B is a C-V curve showing the relationship of the tuning voltage and the capacitance of a prior art varactor circuit.
Figure 3:
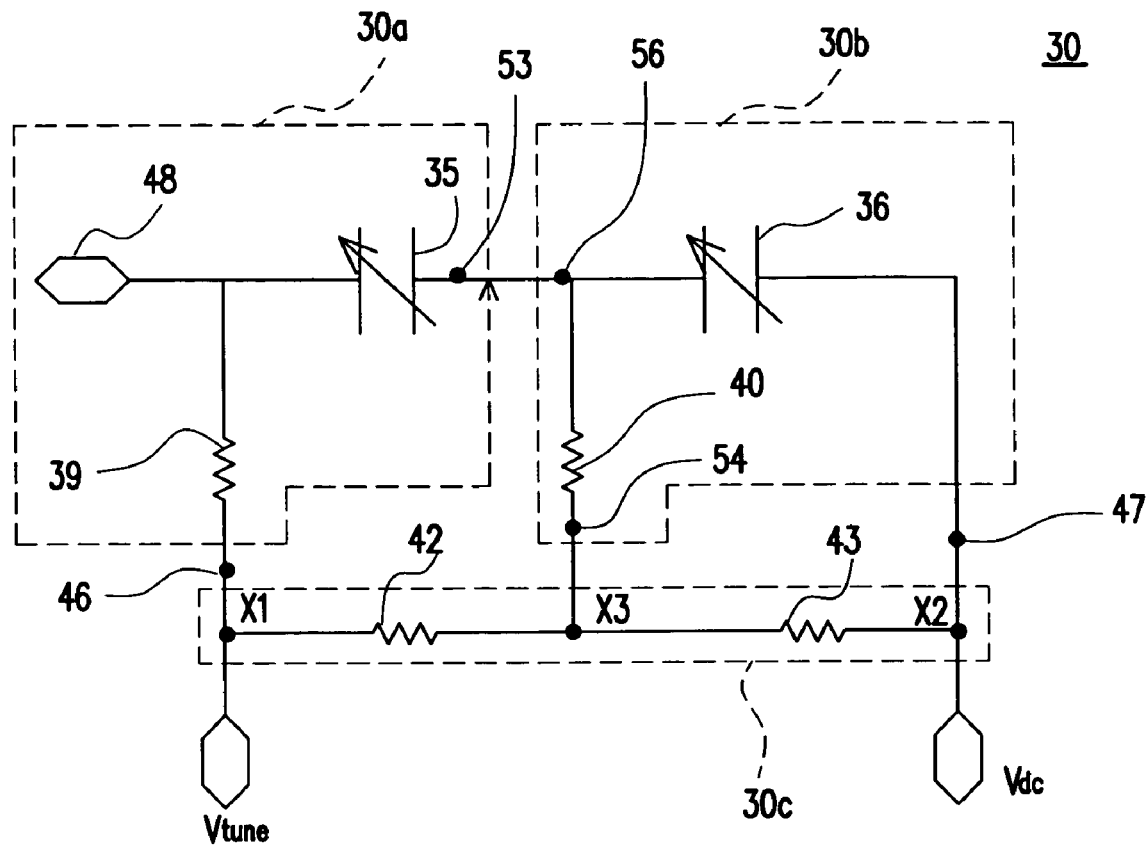
FIG. 3 is a schematic view of a two-level linear tuning varactor circuit according to a preferred embodiment of the present invention.

FIG. 3 is a schematic drawing showing a two-level linear tuning varactor circuit according to a preferred embodiment of the present invention. Referring to FIG. 3, the two-level linear tuning varactor circuit 30 comprises a first single-end varactor circuit 30a, a second single-end varactor circuit 30b and a voltage divider circuit 30c. The first single-end varactor circuit 30a comprises a tuning terminal 46 and the second single-end varactor circuit 30b has a reference terminal 47. The first and the second single-end varactor circuits 30a and 30b, respectively, are coupled to each other in series. The voltage divider 30c has a first terminal X1, a second terminal X2 and a voltage divider X3. The first terminal X1 is coupled to the tuning terminal 46, the second terminal X2 is coupled to the reference voltage terminal 47, and the voltage dividing terminal X3 is coupled to the node of the first single-end varactor circuit 30a and the second single-end varactor circuit 30b. The tuning terminal 46 of the first single-end varactor circuit 30 is adapted to receive a tuning voltage $V_{tune}$ for tuning a capacitance of the two-level linear tuning varactor circuit 30. It means that the tuning terminal 46 serves as the tuning port of the whole circuit. The reference voltage terminal 47 of the second single-end varactor circuit 30b is adapted to receive a reference voltage with a fixed voltage $V_{dc}$ as a reference level. It means the reference voltage terminal 47 serves as the reference port of the whole circuit.

Referring to FIG. 3, the first single-end varactor circuit 30a further comprises a reference voltage terminal 53, a connecting terminal 48 and a varactor 35. A terminal of the varactor is coupled to the connecting terminal 48, and another terminal thereof is coupled to the reference voltage terminal 53. The tuning terminal 46 connects to the connecting terminal 48 through a resistor 39. The second single-end varactor circuit 30b further comprises a tuning terminal 54, a connecting terminal 56 and a varactor 36. A terminal of the varactor 36 is coupled to the connecting terminal 56, and another terminal thereof is coupled to the reference voltage terminal 47. The tuning terminal 54 connects to the connecting terminal 56 through a resistor 40. The connection of the first single-end varactor circuit 30a and the second single-end varactor circuit 30b is described below. The reference voltage terminal 53 of the first single-end varactor circuit 30a is coupled to the connecting terminal 56 of the second single-end varactor circuit 30b, and the tuning terminal 54 of the second single-end varactor circuit 30b is coupled to the voltage dividing terminal X3 of the voltage divider 30c.

Figure 4A:
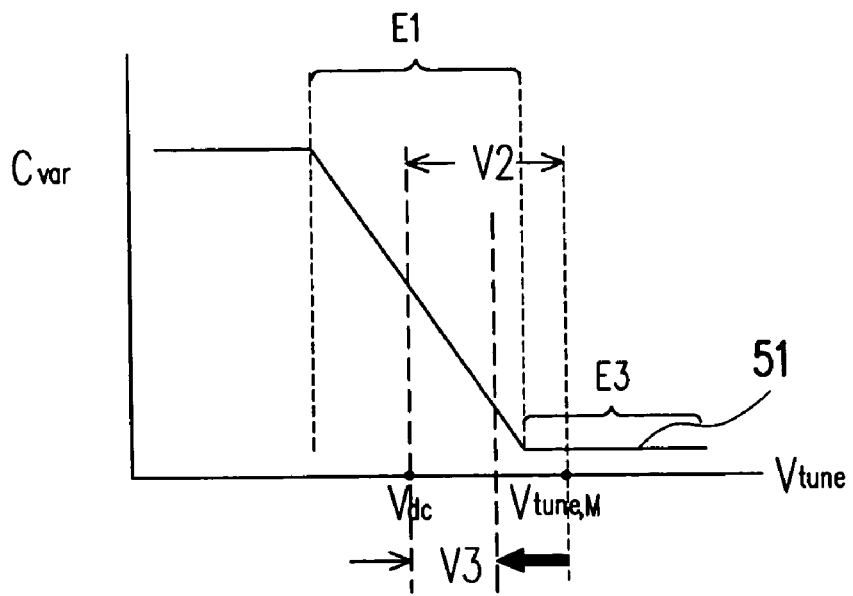
FIG. 4A is a C-V curve showing a relationship between the capacitance and the tuning voltage of the preferred two-level linear tuning varactor circuit of the present invention.
Figure 8A:
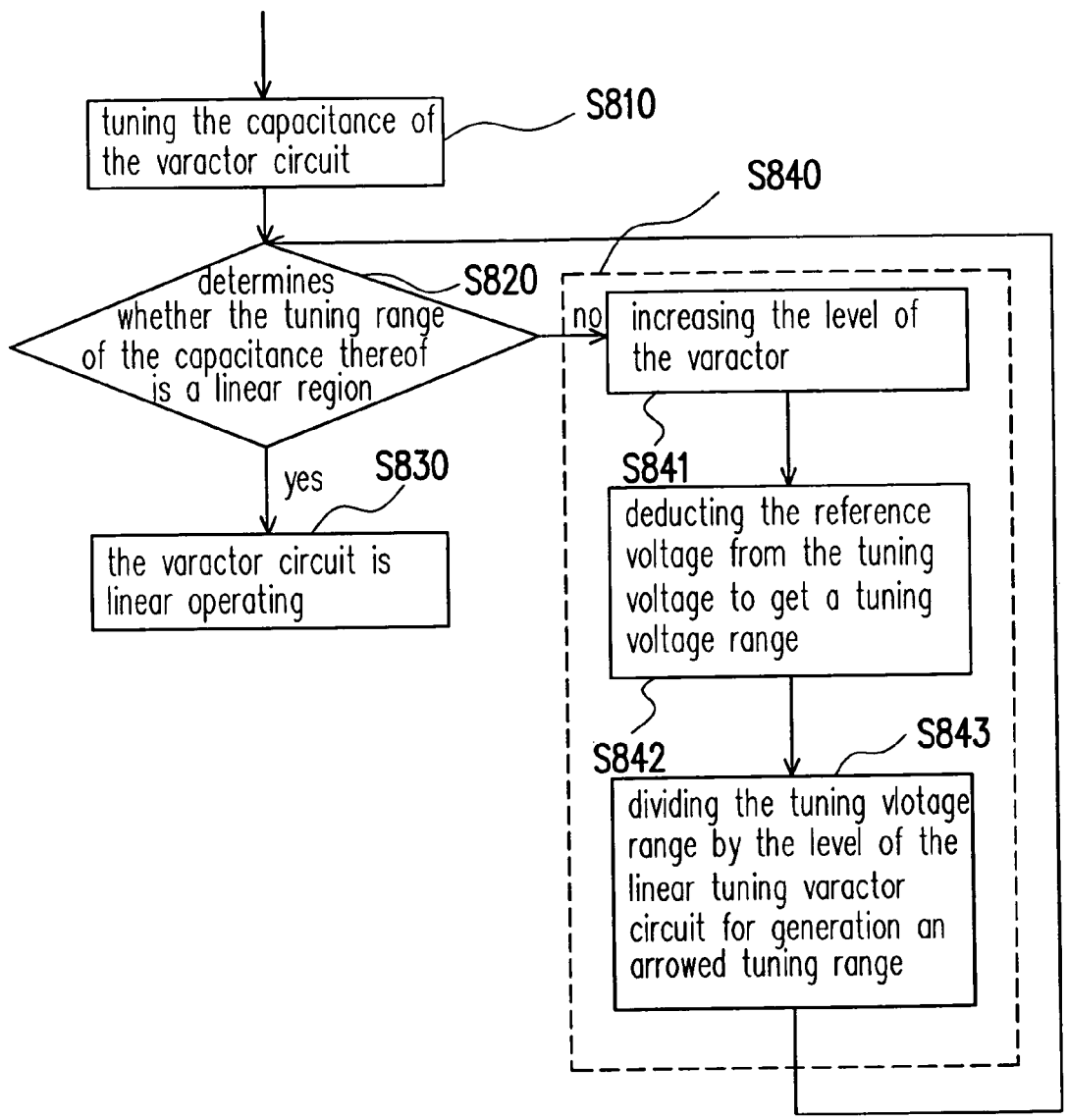
FIG. 8A is a flow chart showing a method of tuning the linear tuning varactor circuit according to a preferred embodiment of the present invention.

FIG. 4A is a C-V curve showing a relationship between the capacitance and the tuning voltage of the preferred two-level linear tuning varactor circuit of the present invention. FIG. 8A is a flow chart showing a method of tuning the linear tuning varactor circuit according to a preferred embodiment of the present invention. Referring to FIGS. 3, 4A and 8A, region E1 of FIG. 4A is the linear region of the curve 51 of the capacitance $C_{var}$ and the tuning voltage $V_{tune}$ of the linear tuning varactor circuit. In step S810, when tuning the tuning voltage $V_{tune}$, such as the single-end varactor circuit 30a, the capacitance $C_{var}$ varies corresponding thereto. Step S820 determines whether the tuning range of the capacitance $C_{var}$ thereof is a linear region. When the tuning range V2 is not a linear region E1, step S840 narrows the tuning range V2 to V3 and makes the circuit operates therein.

Figure 8B:
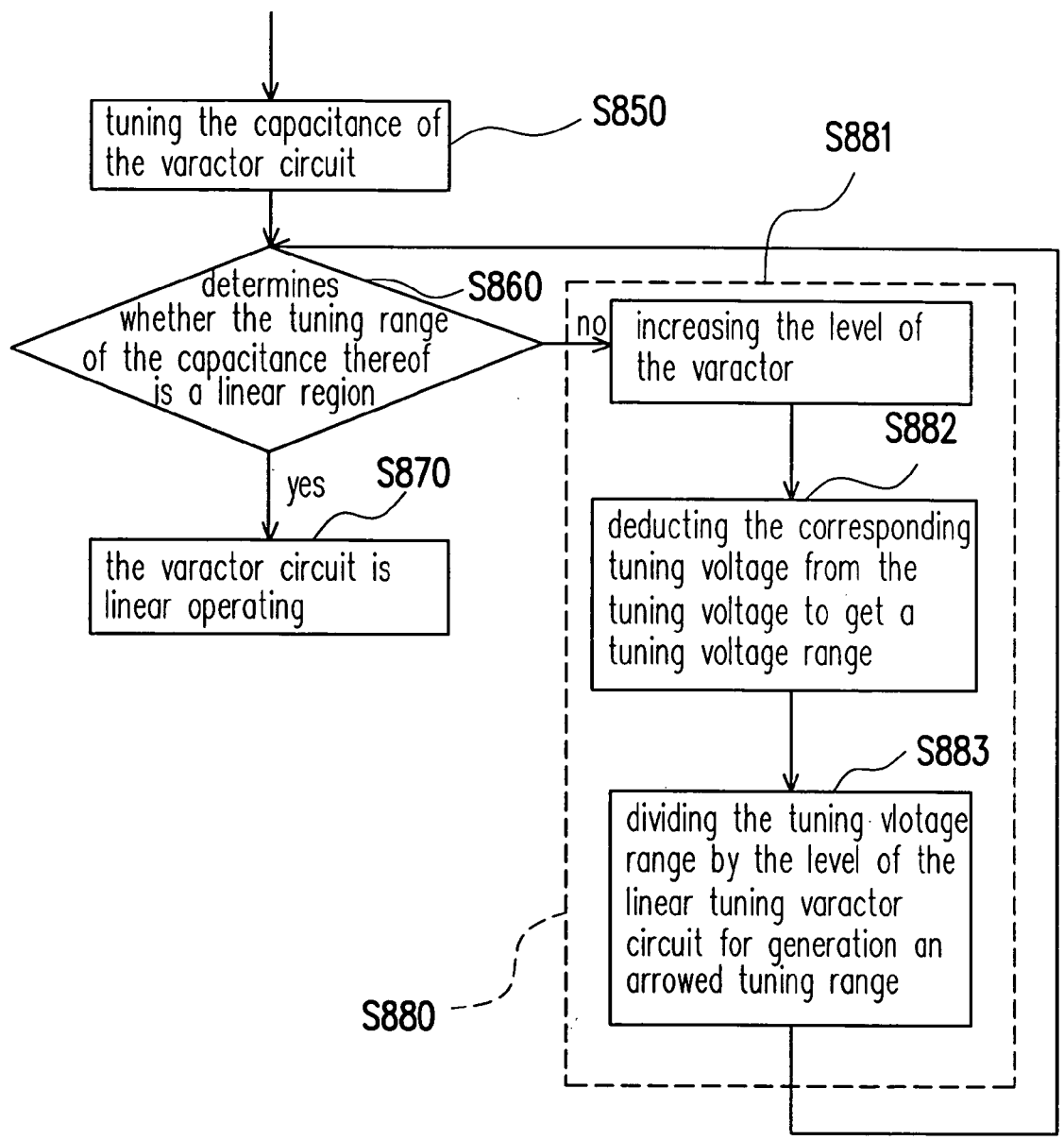
FIG. 8B is a flow chart showing a method of tuning the linear tuning varactor circuit according to another preferred embodiment of the present invention.
Figure 8C:
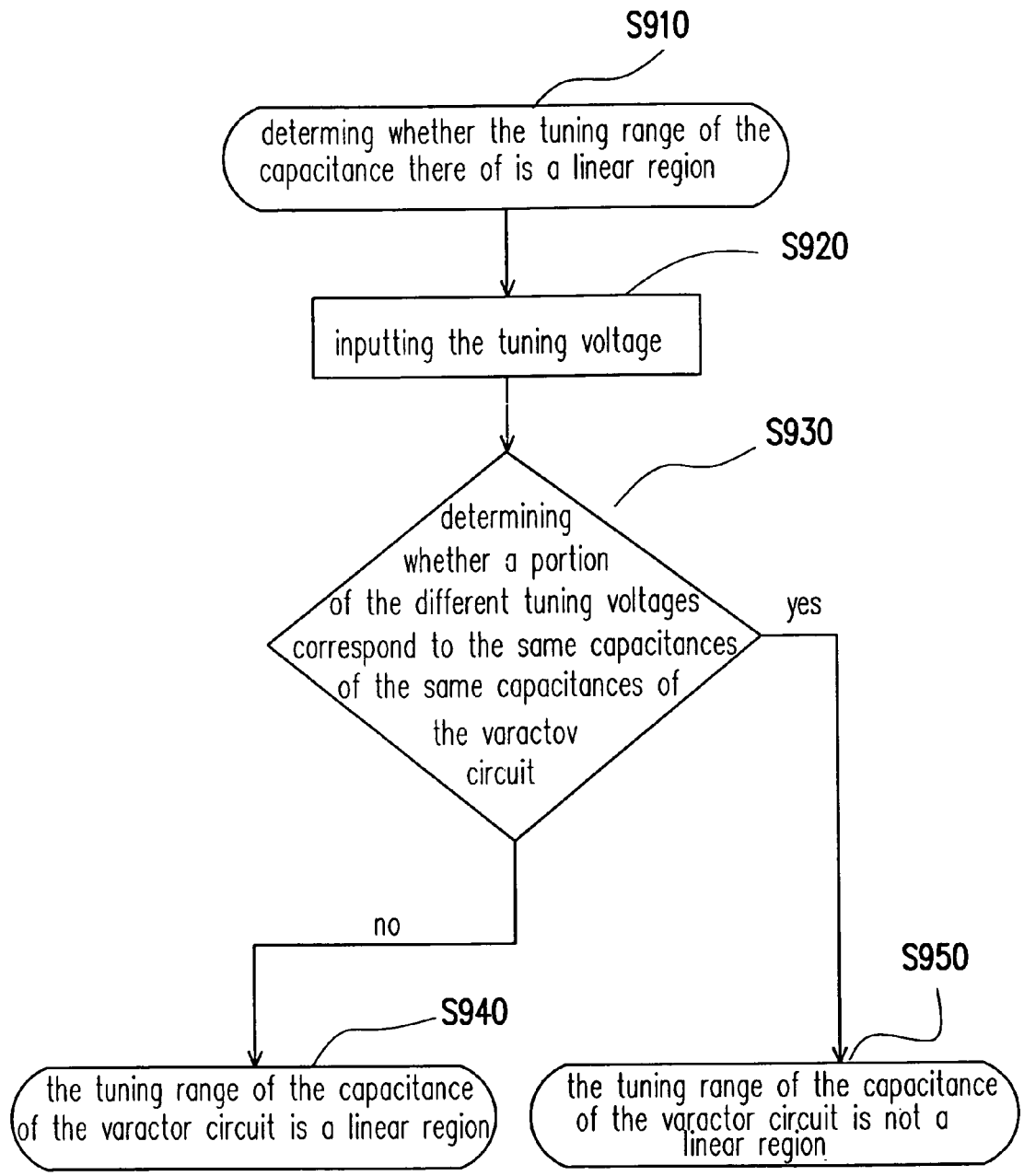
FIG. 8C is a flow chart showing a method of determining whether or not the tuning region is a linear region of the linear tuning varactor circuit according to a prferred embodiment of the present invention.

FIG. 8C is a flow chart showing a method of determining whether or not the tuning region is a linear region of the linear tuning varactor circuit according to a preferred embodiment of the present invention. Referring to FIGS. 3, 4 and 8C, step S920 inputs the tuning voltage $V_{tune}$. Step S930 determines whether a different portion of the tuning voltages $V_{tune}$ correspond to the same capacitances $C_{var}$ of the linear tuning varactor circuit. As shown in the region E1 of curve 51 of FIG. 4A, when the different portion of the tuning voltages $V_{tune}$ are not higher than a pre-set percentage, the tuning range of the capacitance $C_{var}$ of the varactor circuit is a linear region as shown in step S940. On the other hand, as shown in the region E2 of curve 51 of FIG. 4A, when the different portion of the tuning voltages $V_{tune}$ are higher than the pre-set percentage, the tuning range of the capacitance $C_{var}$ of the varactor circuit is not a linear region as shown in step S950.

Referring to FIGS. 3, 4A and 8A, following are the descriptions how to narrow the tuning range of the capacitance $C_{var}$ thereof. As shown in FIG. 4A, the tuning range V2 of the capacitance $C_{var}$ thereof is $V_{tune,M}$–$V_{dc}$, wherein the $V_{tune,M}$ is the maximum of the tuning voltage. Because the tuning range V2 covers the non-linear region of the curve 51, step S841 increases the level of the varactor circuit for tuning the tuning range of the capacitance $C_{var}$ in the linear region E1. As shown in FIG. 3, the second single-end varactor circuit 30b coupled to the first single-end varactor 30a cooperates with the voltage divider 30c for composing the two-level single-end varactor circuit 30. Following the steps S842 and S843, formulae are generated from the two-level single-end varactor circuit 30. For simplification, it is assumed that resistors 42 and 43 have the same resistance. The dividing voltage $V_{X3}$ on the voltage dividing terminal X3 is:

$$V_{X3} = \frac{V_{tune,M} + V_{dc}}{2}$$

And, the tuning range V3 is:

$$V_3 = V_{tune,M} - V_{X1} = \frac{V_{tune,M} - V_{dc}}{2}$$

From these formulae, the tuning range of the two-level single-end varactor circuit 30 still is $V_{tune,M}-V_{dc}$. Through the voltage divider 30c, the tuning range of the two-level single-end varactor circuit 30 narrows to a half of the original. From FIG. 4A, the narrowed tuning range V3 is fully within the linear region E1. For simplifying the measurement of the embodiment, the resistors 42 and 43 have the same resistance. However, the present invention is not limited thereto. One of ordinary skill in the art will understand that the resistors 42 and 43 are adjustable.

Figure 4B:
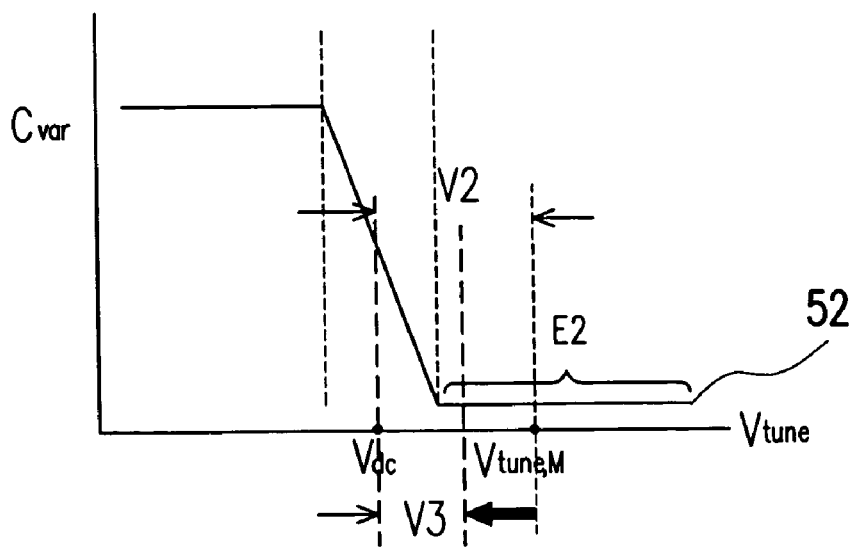
FIG. 4B is a C-V curve showing another relationship between the capacitance and the tuning voltage of the preferred two-level linear tuning varactor circuit of the present invention.

FIG. 4B is a C-V curve showing another relationship between the capacitance and the tuning voltage of the preferred two-level linear tuning varactor circuit of the present invention. Referring to FIG. 4B, although the tuning range is narrowed from V2 to V3, it still covers the non-linear region E2 of the curve 52. Therefore, the level of the varactor circuit should be increased for narrowing the tuning range within the linear region E2.

Figure 5A:
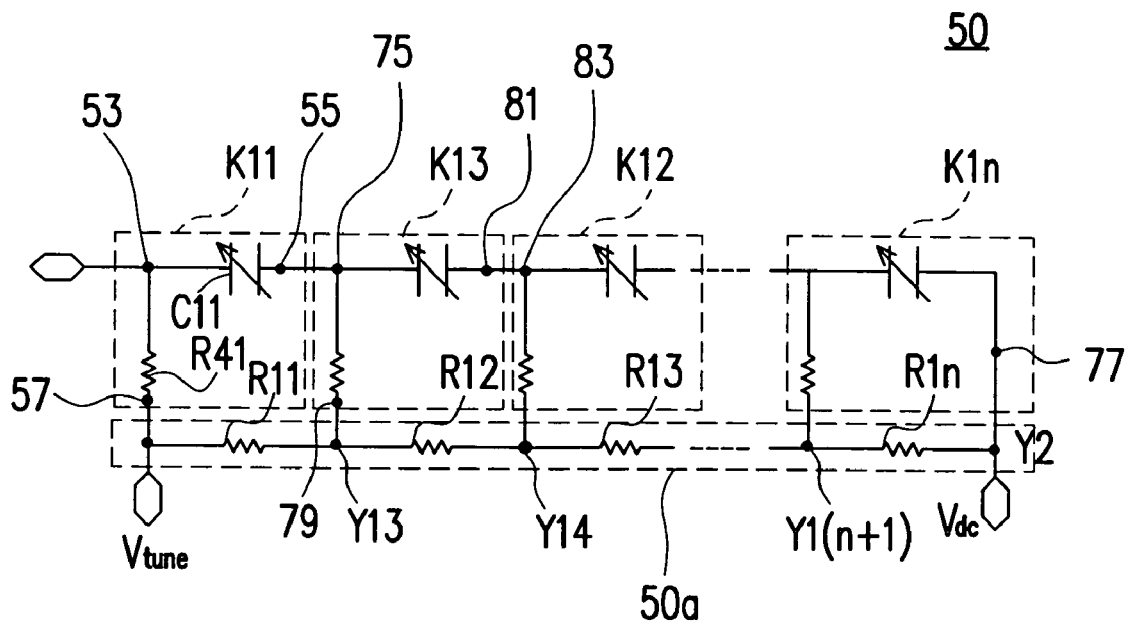
FIG. 5A is a schematic view of an N-level varactor circuit according to a preferred embodiment of the present invention.

FIG. 5A is a schematic view of a N-level varactor circuit according to a preferred embodiment of the present invention. Referring to FIG. 5A, the N-level varactor circuit 50 comprises a plurality of single-end varactor circuits K11–K1n and a voltage divider 50a. The single-end varactor circuits K11–K1n are coupled in series. Each of the single-end varactor circuits, such as the single-end varactor circuit K11, has a tuning terminal 57 and a reference voltage terminal 55. The tuning terminal 57 of the first single-end varactor circuit K11 of the single-end varactor circuits K11–K1n is adapted to receive a tuning voltage $V_{tune}$ for tuning a capacitanceof the N-level varactor circuit thereof. The reference voltage terminal 77 of a last single-end varactor circuit K1n of the single-end varactor circuits K11–K1n is adapted to receive a reference voltage $V_{dc}$ as a reference level. It means that the tuning terminal 57 serves as the tuning port of the whole N-level varactor circuit 50; the reference voltage terminal 77 serves as the reference voltage port thereof.

Referring to FIG. 5A, the voltage divider 50c has a first terminal Y11, a plurality of voltage dividing terminals Y13–Y1(n+1) and a second terminal Y12. The first terminal Y11 is coupled to the tuning terminal 57, the second terminal Y12 is coupled to the reference voltage terminal 77 and the voltage dividing terminals Y13–Y1(n+1) are coupled to nodes of the single-end varactor circuits K11–K1n. Each of the voltage dividing terminals Y13–Y1(n+1) has a divided voltage, which results from dividing a voltage difference between the tuning voltage $V_{tune}$ and the reference voltage $V_{dc}$ by the voltage divider 50a with a pre-set voltage dividing ratio.

Referring to FIG. 5A, each of the single-end varactor circuits K11–K1n similar to the first single-end varactor circuit K11 further comprises a connecting terminal 53 and a varactor C11. For simplification, following is the description of the varactor C11. A terminal of the varactor C11 is coupled to the connecting terminal 53, and another terminal of the varactor C11 is coupled to the reference voltage terminal 55 which is similar to that of the first embodiment. The tuning terminal 57 is coupled to the connecting terminal 53. The connection of the single-end varactor circuits K11–K1n of this embodiment is similar to that of the first embodiment. Following is the description of the single-end varactor circuits K12. The connecting terminal 75 of the single-end varactor circuits K12 is coupled to the reference voltage terminal 55 of single-end varactor circuits K11. The reference voltage terminal 81 of the single-end varactor circuit K12 is coupled to the connecting terminal 83 of the single-end varactor circuits K13. The tuning terminal of the single-end varactor circuit K12 is coupled to the voltage dividing terminal Y13 of the voltage divider 50a.

Referring to FIG. 5A, the voltage divider 50 a further comprises resistors R11–R1n, which are coupled to each other in series. A terminal of the resistor R11 is coupled to the tuning terminal 57. A terminal of the resistor R1n is coupled to the reference voltage terminal 77. The nodes of the resistors R11–R1n are coupled to the voltage dividing terminals Y13–Y1(n+1) of the voltage divider 50c.

Figure 5B:
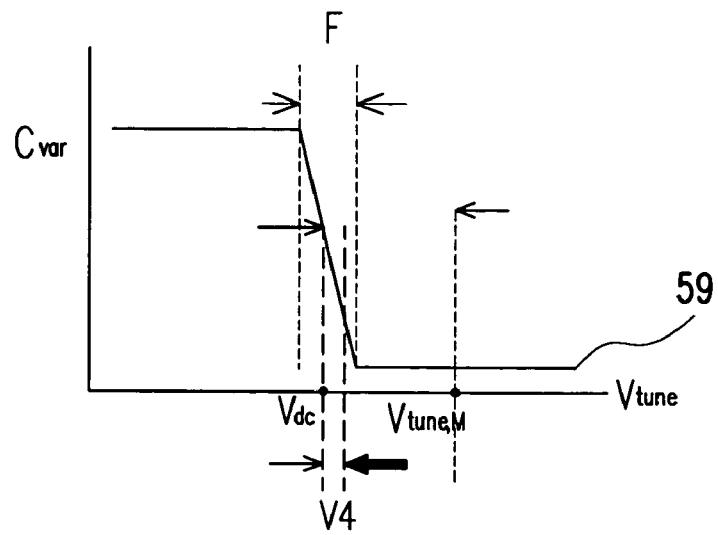
FIG. 5B is a C-V curve showing a relationship between the capacitance and the tuning voltage of the preferred N-level linear tuning varactor circuit of the present invention.

FIG. 5B is a C-V curve showing a relationship between the capacitance and the tuning voltage of the preferred N-level linear tuning varactor circuit of the present invention. Referring to FIGS. 4B, 5A and 5B, similar to FIG. 4B, if, after narrowing, the tuning range of the capacitance still covers the non-linear region E2 of curve 52, the level of the varactor circuit should be increased, such as the N-level linear tuning varactor circuit 50 shown in FIG. 5A. The level of the N-level linear tuning varactor circuit 50 is up to the designer for narrowing the tuning range of the capacitance within the linear region. As shown in FIG. 5B, the tuning range of the capacitance V4 is within the linear region F of the curve 59.

Referring to FIGS. 5A and 5B, the N-level linear tuning varactor circuit 50 can generate formulae. For simplifying the measurement, it is assumed that the resistors R11–R1n have the same resistance, wherein the $V_{tune,M}$ is the maximum of the tuning voltage. Therefore, the dividing voltage $V_{Y13}$ on the voltage dividing terminal Y13 is:

$$V_{Y13} = \frac{(N-1)V_{tune,M} + V_{dc}}{N}$$

And, the tuning range V4 is:

$$V_4 = V_{tune,M} - V_{Y1} = \frac{V_{tune,M} - V_{dc}}{N}$$

Similar to the first embodiment, the tuning range of the N-level single-end varactor circuit 50 still is $V_{tune,M}-V_{dc}$. Through the voltage divider 50a, the tuning range of the n-level single-end varactor circuit 50 narrows to 1/N of the original. From FIG. 5B, the narrowed tuning range V4 is fully within the linear region F of the curve 59. For simplifying the measurement of the embodiment, the resistors R11–R1n have the same resistance. However, the present invention is not limited thereto. One of ordinary skill in the art will know that the resistors R11–R1n are adjustable.

Accordingly, the tuning range of the capacitance of the varactor circuit can be tuned within the linear range of the curve by increasing the level thereof whether the linear region is very narrow. Following is a formula of determining the levels that are sufficient to narrow the tuning range of the capacitance.

$$N \geq \frac{V_X}{V_Z}$$

Wherein Vx represents the tuning range of the capacitance of the original varactor circuit; $V_Z$ represents the expected tuning range thereof.

The two embodiments can achieve the object by coupling the single-end varactor circuits in series. Following are the descriptions of achieving the same object by using differential varactor circuits.

Figure 6A:
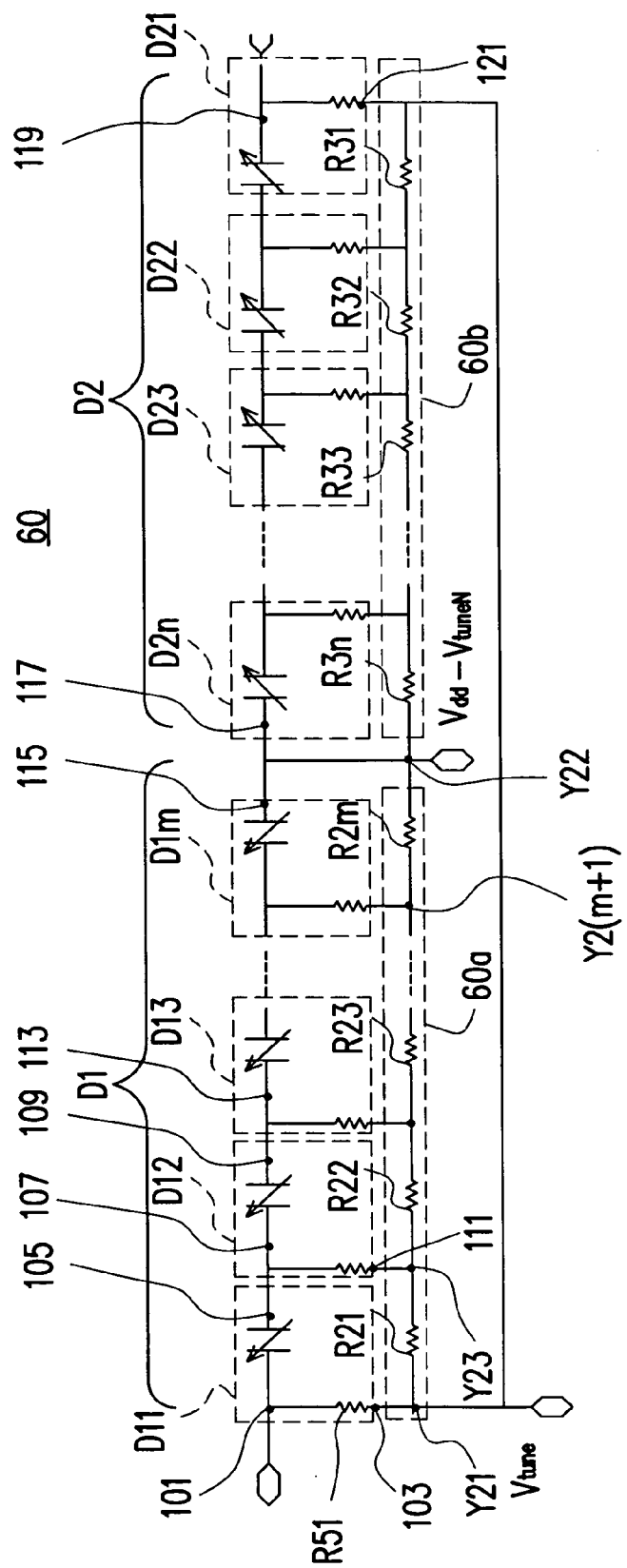
FIG. 6A is a schematic view of a N-level differential varactor circuit according to preferred embodiment of the present invention.

FIG. 6A is a view of a N-level differential varactor circuit according to a preferred embodiment of the present invention. Referring to FIG. 6A, the N-level differential varactor circuit 60 comprises a first set of single-end varactor circuits D1, a second set of single-end varactor circuits D2, a first voltage divider 60a and a second voltage divider 60b. The first set of single-end varactor circuits D1 has single-end varactor circuits D11–D1m, which are coupled in series. Each of the single-end varactor circuits D11–D1m is like the single-end varactor circuit D11 having a tuning terminal 103 and a corresponding tunning terminal 105. The tuning terminal of a first single-end varactor circuit D11 of the single-end varactor circuits D11–D1m is adapted to receive a tuning voltage $V_{tune}$, and the corresponding tuning terminal 115 of a last varactor D1m is adapted to receive a corresponding tuning voltage $V_{tuneN}$ for determining a capacitance thereof.

Referring to FIG. 6A, the first voltage divider 60a has a first terminal Y21, a plurality of voltage dividing terminals Y23–Y2(m+1) and a second terminal Y22. The first terminal Y21 is coupled to the tuning terminal 103, the second terminal Y22 is coupled to the corresponding terminal 115, and the voltage dividing terminals Y23–Y2(m+1) are coupled to nodes of the single-end varactor circuits D11–D1m. Similar to the last embodiment, each of the voltage dividing terminals Y23–Y2(m+1) has a divided voltage, which results from dividing a voltage difference between the tuning voltage $V_{tune}$ and the reference voltage $V_{tuneN}$ by the first voltage divider with a pre-set voltage dividing ratio.

Referring to FIG. 6A, the second set of single-end varactor circuits D2 has single-end varactor circuits D21–D2n, which have the same number as the first set of single-end varactor circuits D1 and are coupled in series. In the single-end varactor circuits D21–D2n, the tuning terminal 121 of the first single-end varactor circuit D21 is coupled to the tuning terminal 103 of the single-end varactor circuit D11; the corresponding tuning terminal 117 of the last single-end varactor circuit D2n is coupled the corresponding tuning terminal 115 of the single-end varactor circuit D1m. The structure and the coupling, connecting to the second set of single-end varactor circuits D2, of the voltage divider 60b are similar to those of the first voltage divider 60a. Detail descriptions are therefore not repeated.

Referring to FIG. 6A, each of the single-end varactor circuits D11–D1m and D21–D2n similar to the single-end varactor circuit D11 further comprises a connecting terminal 101 and a varactor C21. For simplification, following is the description of the varactor C21. A terminal of the varactor C21 is coupled to the connecting terminal 101, and another terminal of the varactor C11 is coupled to the reference voltage terminal 105. The tuning terminal is coupled to the connecting terminal through the resistor R51. The connection of the single-end varactor circuits D11–D1m and D21–D2n is described by using D12 as an example. Following is the description of the single-end varactor D12. The connecting terminal 107 of the single-end varactor D12 is coupled to the reference voltage terminal 105 of single-end varactor D11. The reference voltage terminal 109 of the single-end circuit D12 is coupled to the connecting terminal 113 of the single-end varactor circuits D13. The tuning terminal of the single-end varactors D12 is coupled to the voltage dividing terminal Y23 of the first voltage divider.

The first and the second voltage dividers 60a and 60b, respectively, further comprises the same number of resistors R21–R2m and R31–R3n and have the same structure. For simplification, following are the descriptions of the resistors R21–R2m of the first voltage divider 60a. The resistors R21–R2m are coupled in series. A terminal of the resistor R21 is coupled to the tuning terminal 103. A terminal of the resistor R2m is coupled to the corresponding tuning terminal 115. The nodes of the resistors R21–R2m are the voltage dividing terminals Y23–Y2(m+1) of the voltage divider 60a.

Figure 6B:
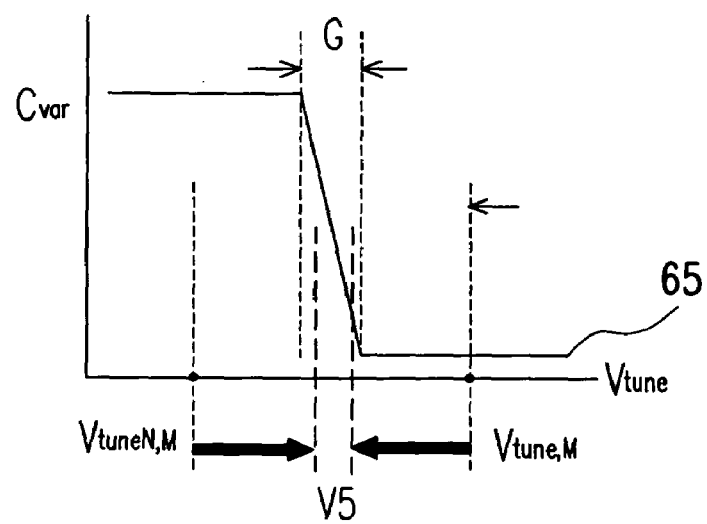
FIG. 6B is a C-V curve showing a relationship of the tuning voltage and the capacitance of another preferred N-level differential varactor circuit of the present invention.

FIG. 6B is a C-V curve showing a relationship of the tuning voltage and the capacitance of another preferred N-level differential varactor circuit of the present invention. Referring to FIGS. 6A, 6B and 8B, the method of tuning the differential varactor circuit includes steps S850–S880, which are similar to those of the last two embodiments. The difference is that, in the embodiment, the differential varactor circuit has corresponding tuning terminals for receiving the corresponding tuning voltages, which are not fixed. According to steps S881 and S882, it is assumed that the resistors R21–R2m and R31–R3n have the same resistance. The maximum of the tuning voltage is $V_{tune,M}$; and the maximum of the corresponding tuning voltage is $V_{tuneN,M}$. The tuning range V5 of the capacitance of the varactor circuit is:

$$V_5 = \frac{V_{tune,M} - V_{tuneN,M}}{N}$$

As shown in FIG. 6B, the tuning range V5 of the capacitance of the varactor circuit is within the linear region G of the curve 65. The differential varactor circuit can substantially perform the same function of the single-end varactor circuit. Similar to the last two embodiments, the resistors R21–R2m and R31–R3n have the same resistance. However, the present invention is not limited thereto. One of ordinary skill in the art will understand that the resistors R21–R2m and R31–R3n are adjustable.

Figure 7A:
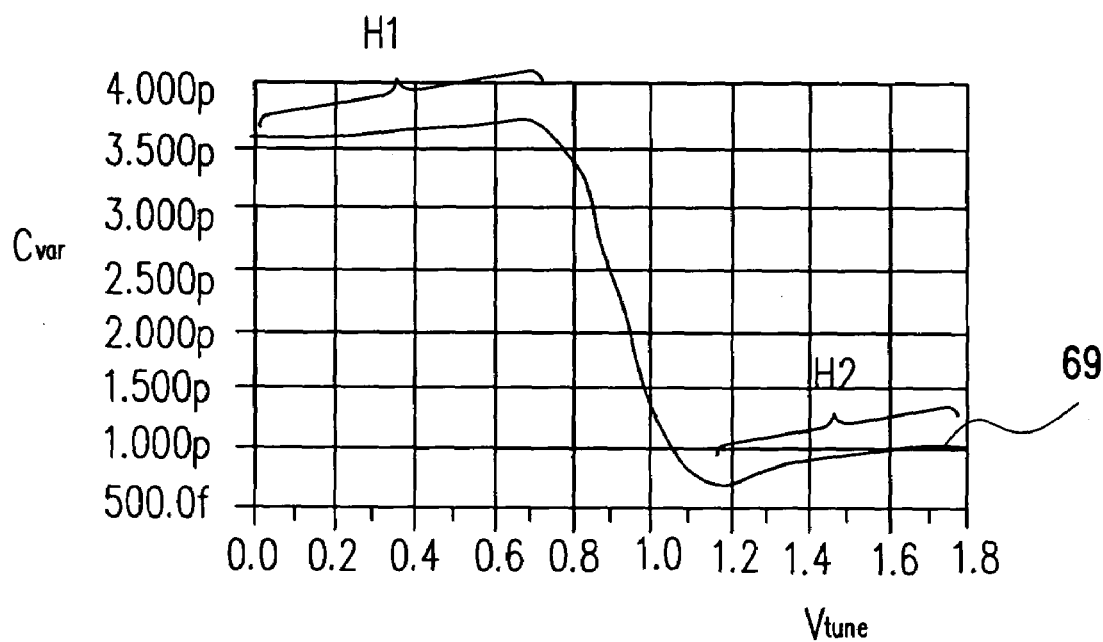
FIG. 7A is a C-V curve showing a relationship of the tuning voltage and the capacitance of a two-level varactor circuit of the present invention.
Figure 7B:
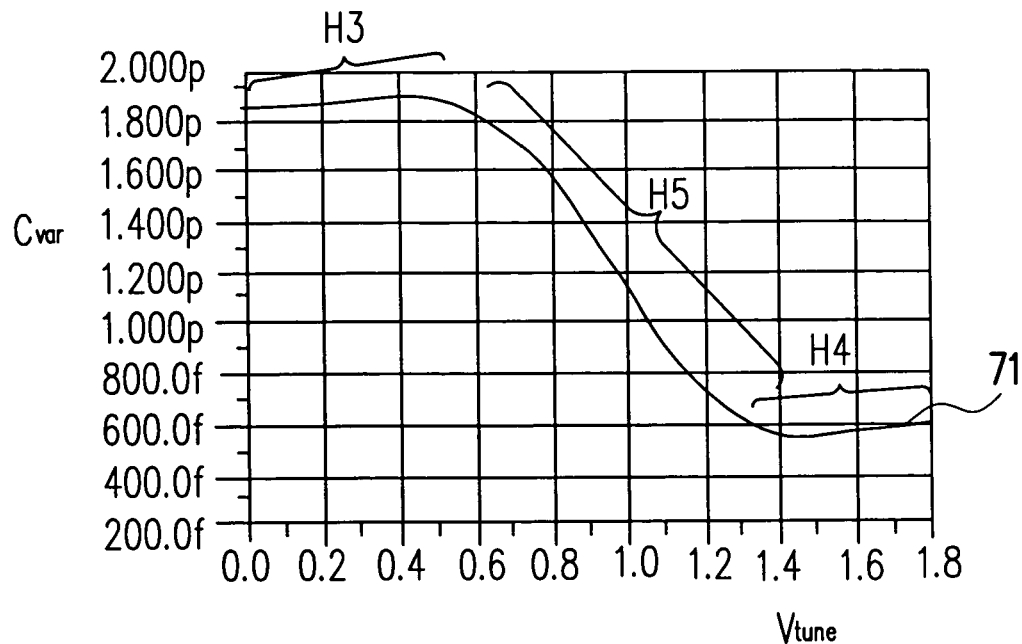
FIG. 7B is a C-V curve showing a relationship of the tuning voltage and the capacitance of a four-level varactor circuit of the present invention.
Figure 7C:
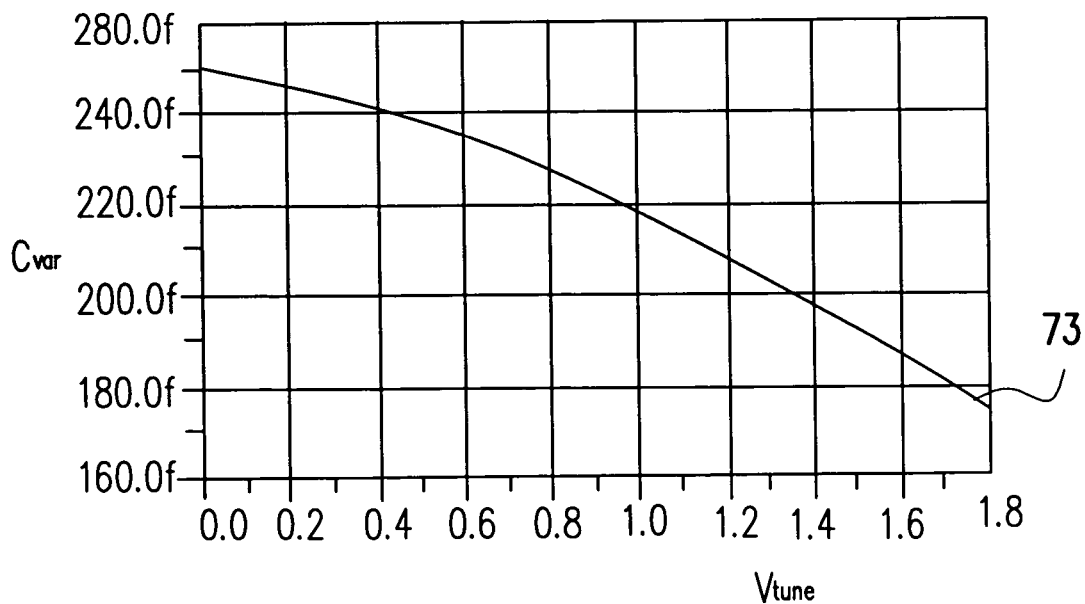
FIG. 7C is a C-V curve showing a relationship of the tuning voltage and the capacitance of a eight-level varactor circuit of the present invention.

FIG. 7A is a C-V curve showing a relationship of the tuning voltage and the capacitance of a two-level varactor circuit of the present invention. FIG. 7B is a C-V curve showing a relationship of the tuning voltage and the capacitance of a four-level varactor circuit of the present invention. FIG. 7C is a C-V curve showing a relationship of the tuning voltage and the capacitance of an eight-level varactor circuit of the present invention. Referring to FIGS. 7A–7C, the longitudinal axel is the capacitance $C_{vax}$ of the varactor circuit, and the transverse axel is the tuning voltage $V_{tune}$, which has a range about 0 V–1.8 V. The curve 69 shown in FIG. 7A has non-linear regions H1 and H2. In FIG. 7B, the linear region H5 of the curve 71 increases, but the non-linear regions H3 and H4 still exist. In FIG. 7C, the curve 73 is nearly linear, and the tuning range is within the linear region.

According to the above three embodiments, the present invention can tune the tuning range of the capacitance of the varactor circuit within the linear region by increasing the level of the varactor circuit regardless of whether it is a single-end varactor circuit or a differential circuit and how narrow the capacitance linear region is.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A linear tuning varactor circuit, comprising:

a plurality of single-end varactor circuits, each having a tuning terminal and a reference voltage terminal, the single-end varactor circuits coupled in series, a tuning terminal of a first single-end varactor circuit adapted to receive a tuning voltage for tuning a capacitance of the varactor circuit, a reference voltage terminal of a last single-end varactor circuit adapted to receive a reference voltage as a reference level; and a voltage divider, having a first terminal, a plurality of voltage dividing terminals and a second terminal, the first terminal coupled to the tuning terminal of the first single-end varactor circuit, the second terminal coupled to the reference voltage terminal of the last single-end varactor circuit, wherein the voltage dividing terminals of the voltage divider are coupled to nodes of the single-end varactor circuits, and each of the voltage dividing terminals has a divided voltage, which results from dividing a voltage difference between the tuning voltage and the reference voltage by the voltage divider with a pre-set voltage dividing ratio.

2. The linear tuning varactor circuit of claim 1, wherein the single-end varactor circuits further comprise connecting terminals, a connecting terminal of a second single-end varactor circuit is coupled to the reference voltage terminal of the first single-end varactor circuit, a reference voltage terminal of the second single-end varactor circuit is coupled to a connecting terminal of a third single-end varactor circuit, and the others follow a connection similar thereto.

3. The linear tuning varactor circuit of claim 2, wherein, except for the first single-end varactor circuit, the tuning terminals of the single-end varactor circuits are coupled to the voltage dividing terminals of the voltage divider.

4. The linear tuning varactor circuit of claim 1, wherein the voltage divider further comprises a plurality of resistors coupled in series, a terminal of a first resistors is coupled to the first terminal, a terminal of a last resistor is coupled to the second terminal, and nodes of resistors are to the voltage dividing terminals.

\* \* \* \* \*